(12) United States Patent
Piirainen (10) Patent No.: US 9,979,413 B2
(45) Date of Patent: May 22, 2018

(54) IMPROVING COMMUNICATION EFFICIENCY

(71) Applicant: Nokia Solutions and Networks Oy, Espoo (FI)

(72) Inventor: Olli Juhani Piirainen, Oulu (FI)

(73) Assignee: Nokia Solutions and Networks Oy, Espoo (FI)

( * ) Notice: Subject to any disclaimer, the term of this patent is extended or adjusted under 35 U.S.C. 154(b) by 0 days. days.

(21) Appl. No.: 15/513,250

(22) PCT Filed: Sep. 25, 2014

(86) PCT No.: PCT/EP2014/070518
§ 371 (c)(1),
(2) Date: Mar. 22, 2017

(87) PCT Pub. No.: WO2016/045733
PCT Pub. Date: Mar. 31, 2016

(65) Prior Publication Data
US 2017/0250704 A1 Aug. 31, 2017

(51) Int. Cl.
H03M 7/00 (2006.01)
H03M 7/24 (2006.01)
H03M 7/30 (2006.01)

(52) U.S. Cl.
CPC ............... *H03M 7/24* (2013.01); *H03M 7/30* (2013.01)

(58) Field of Classification Search
CPC .................................. H03M 7/24; H03M 7/30
USPC ......................................................... 341/50
See application file for complete search history.

(56) References Cited

U.S. PATENT DOCUMENTS 7,447,163 B1 * 11/2008 Thomson ................ H04L 5/005
370/252
2013/0054661 A1 2/2013 Wegener ....................... 708/203

FOREIGN PATENT DOCUMENTS

DE 196 25 855 A1 1/1998
WO WO 2014/116712 A1 7/2014

OTHER PUBLICATIONS

Lindstrom, Peter, et al., "Fast and Efficient Compression of Floating-Point Data", IEEE Transactions on Visualization and Computer Graphics, vol. 12, No. 5, Sep./Oct. 2006 , 6 pgs.
Kalliojarvi, Kari, et al., "Roundoff Errors in Block-Floating-Point Systems", IEEE Transaction on Signal Processing, vol. 44, No. 4, Apr. 1996, 8 pgs.

* cited by examiner

*Primary Examiner* — Khai M Nguyen
(74) *Attorney, Agent, or Firm* — Harrington & Smith (57) ABSTRACT

There is provided a method for uplink data compression, the method including transforming a signal from a time-domain presentation into a frequency-domain presentation, selecting a group of adjacent frequency bins from the frequency-domain presentation, generating a floating point number representation from values of the group of adjacent frequency bins, wherein the floating point number representation includes a mantissa for each of the frequency bins' values of the group of adjacent frequency bins, and wherein the floating point number representation further includes a common exponent shared between the mantissas, and outputting the mantissas of the floating point number representation, and the value of the common exponent shared between the mantissas of the floating point number representation.

20 Claims, 5 Drawing Sheets

504 SELECTING A FOURTH GROUP OF ADJACENT FREQUENCY BINS REPRESENTING A SYMBOL OF A SECOND PHYSICAL RESOURCE BLOCK

506 GENERATING A FOURTH FLOATING POINT NUMBER REPRESENTATION OF THE FOURTH GROUP OF FREQUENCY BINS' VALUES, WHEREIN MANTISSAS SHARE A COMMON EXPONENT WITH THE FLOATING POINT NUMBER REPRESENTATION

508 OUTPUTTING THE FLOATING POINT NUMBER REPRESENTATION AND THE FOURTH FLOATING POINT NUMBER PRESENTATION

IMPROVING COMMUNICATION EFFICIENCY

TECHNICAL FIELD

The invention relates to communications.

BACKGROUND

The demand for more efficient networks has risen in the recent years as applications and services have become more and more data demanding. Therefore, controlling the amount of data may be beneficial for the performance of the network.

BRIEF DESCRIPTION

According to an aspect, there is provided the subject matter of the independent claims.

Some further embodiments are defined in the dependent claims.

BRIEF DESCRIPTION OF DRAWINGS

In the following embodiments will be described in greater detail with reference to the attached drawings, in which.

DETAILED DESCRIPTION OF SOME EMBODIMENTS

The following embodiments are exemplary. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

Embodiments described may be implemented in a radio system, such as in at least one of the following: Worldwide Interoperability for Micro-wave Access (WiMAX), Global System for Mobile communications (GSM, 2G), GSM EDGE radio access Network (GERAN), General Packet Radio Service (GRPS), Universal Mobile Telecommunication System (UMTS, 3G) based on basic wideband-code division multiple access (W-CDMA), high-speed packet access (HSPA), Long Term Evolution (LTE), LTE-Advanced, and/or 5G system. The present embodiments are not, however, limited to these protocols.

Figure 1:
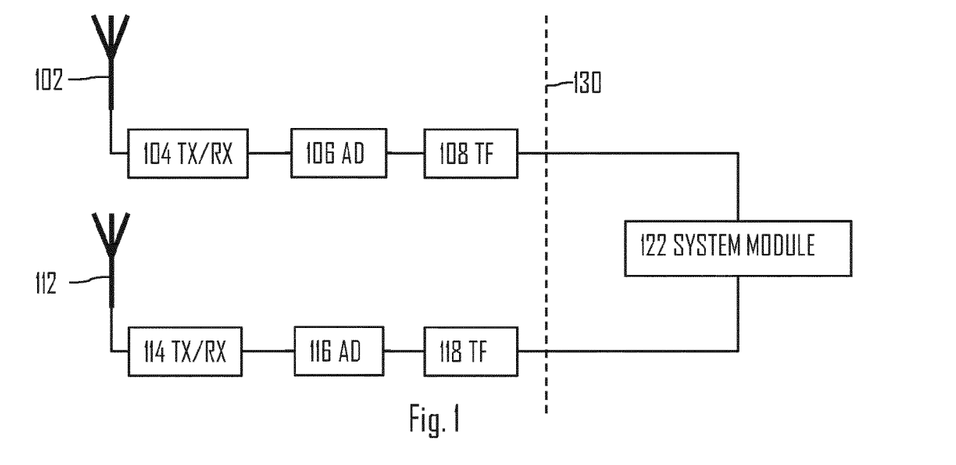
FIG. 1 shows an example telecommunication system to which embodiments of the invention may be applied.

FIG. 1 shows an example of a telecommunication system to which embodiments of the invention may be applied. The telecommunication system may be based on the LTE or the LTE-A of the 3$^{rd}$ Generation Partnership Project (3GPP), for example. The telecommunication system may comprise one or more radio apparatuses, such as a remote radio head (RRH), a base station, a radio network controller (RNC) as in the UMTS, a base station controller (BSC) as in the GSM/GERAN, evolved node B (eNB) as in the LTE and LTE-A, a terminal device or any other apparatus capable of controlling radio communication and managing radio resources within a cell. The radio apparatuses may be connected to each other via a wireless connection. In the case of multiple eNBs in the communication network, the eNBs may be connected to each other with an X2 interface as specified in the LTE. Some or all features described hereinafter may be comprised in a radio apparatus.

The telecommunication system may comprise one or more antennas 102, 112. The antennas 102, 112 may be used by communication interfaces (TX/RX) 104, 114 to transmit and receive data, thus providing wireless communication capability for the system. The antennas 102, 112 may, for example, receive data from terminal devices, such as mobile phone, tablet, phablet, computer, or any other device with wireless capability. The antennas 102, 112 may be comprised in an active antenna system (AAS) and/or be AAS antennas. The received signals may be LTE 20 MHz baseband signals, for example. The signals may comprise I and Q samples. The I and Q samples may require, for example, 16 bits of data in LTE 20 MHz.

The received signals may be converted from analog signals to digital signals by analog-to-digital (AD) converters 106, 116. Furthermore, the digital signals may be transformed from time-domain to frequency domain presentation by time-to-frequency (TF) blocks 108, 118. The transformation of TF blocks 108, 118 may utilize fast Fourier transform (FFT) and/or the use of filter banks for the time-domain to frequency-domain transformation. The transformed signals may be sent to a system module 122, wherein the system module 122 may be responsible for demodulation and/or decoding of the signals, for example. The signals may be sent to the system module 122 via a communication interface 130. The communication interface 130 may utilize Ethernet, optical fiber, common public radio interface (CPRI) and/or open base station standard initiative (OBSAI) RP3, for example.

As the number of antennas 102, 112 increases, the data rate through the interface 130 may become an increasing problem. Furthermore, by using virtualized evolved packet core (EPC), the amount of data to be transferred may further increases. Thus, compressing the data delivered through the interface 130 may be beneficial for the performance of the telecommunication system.

In an embodiment, the radio apparatus comprises the antenna 112, the TX/RX 114, the AD converter 116 and the TF block 118. In an embodiment, the radio apparatus comprises the antennas 102, 112, the communication interfaces 104, 114, the AD converters 106, 116 and the TF blocks 108, 118. Naturally, the radio apparatus may comprise more than two of the above-described elements.

Figure 2:
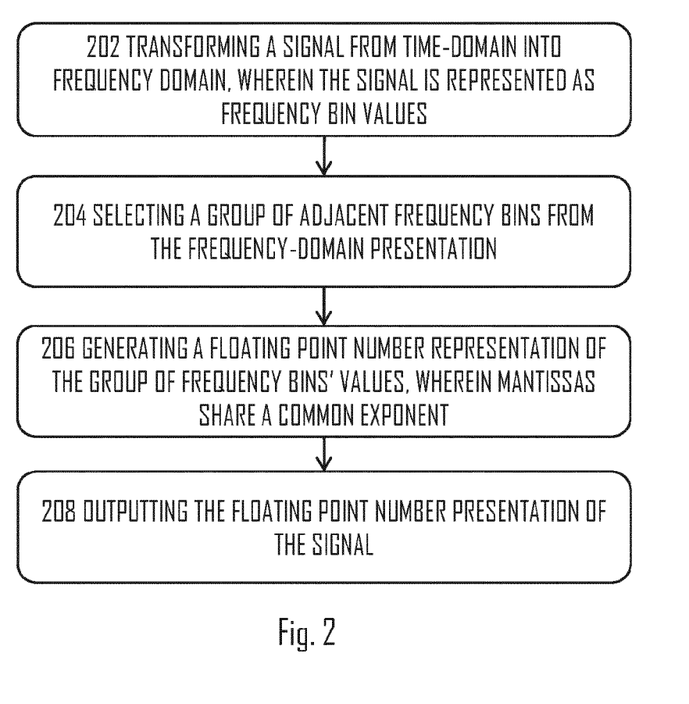
FIG. 2 illustrates an uplink data compression according to an embodiment of the invention.

FIG. 2 illustrates an uplink data compression according to an embodiment of the invention. The uplink data compression described in this invention may be performed, by the radio apparatus, after the TF blocks 108, 118 and before the communication interface 130 of FIG. 1, for example. This may enable the data to be sent to system module 122 to be compressed and requiring less transmission time and/or capability from the communication interface 130. The described invention may be beneficial, for example, in the case of multiple RRHs which transmit the data to the system module 122 using the interface 130.

Referring to FIG. 2, in step 202 a radio apparatus may transform a signal from a time-domain presentation into a frequency-domain presentation, wherein the signal is represented as frequency bin values. An example of this is given in FIG. 1 TF blocks 108, 118. In step 204, the radio apparatus may select a group of adjacent frequency bins from the frequency-domain presentation. The group of adjacent frequency bins may be a certain part of a signal and/or represent a single orthogonal frequency division multiplexing (OFDM) symbol of a physical resource block (PRB), for example.

In step 206, the radio apparatus may generate a floating point number representation from values of the group of adjacent frequency bins, wherein the floating point number representation comprises a mantissa for each of the frequency bins' values of the group of adjacent frequency bins, and wherein the floating point number representation further comprises a common exponent shared between the mantissas. Thus, the frequency bin values maybe represented with a unique mantissa sharing a common exponent. Naturally, as the mantissas share the common exponent, the mantissas have to be formed so that they represent the initial values of the frequency bins. This may mean scaling the mantissas so that together with the common exponent they represent the initial values of the frequency bins.

In step 208, the floating point number representation of the signal is outputted by the radio apparatus. This may mean that the radio apparatus outputs the mantissas of the floating point number representation, and the value of the common exponent shared between the mantissas of the floating point number representation. Thus, the radio apparatus may transmit less data as, for example, only one exponent value may be sent together with a group of mantissas. The group of mantissas may be scaled and/or generated so that they use the same exponent value.

The representation of the signal may be sent to a system module, such as the system module 122 of FIG. 1 via, the communication interface 130 for example. As the representation of the signal may be smaller than the initial signal in terms of data, the amount of data transferred to the system module 122 may decrease. Furthermore, if the data is sent from the system module 122 forward to, for example, group of EPCs it may also decrease the amount of transmitted data. The system module 122 and/or the group of EPCs may perform an inverse operation to the floating point number representation of the signal. This may mean that the compression method may become invisible after the inverse operation.

In an embodiment, the radio apparatus determines magnitude of each adjacent frequency bin value, wherein the adjacent frequency bins are selected by the radio apparatus. The radio apparatus may further select a frequency bin value with the greatest magnitude compared to the other selected frequency bin values. The radio apparatus may scale the adjacent frequency bin values to have the same exponent with the frequency bin value having the greatest magnitude. For example, the frequency-domain representation of the signal may comprise binary values. Each of the frequency bin values may be represented with at least one bit. Thus, the greatest magnitude amongst the frequency bins' values may be determined, and the frequency bin with the greatest magnitude selected. The scale of the frequency bin with the greatest magnitude may be used as a reference scale for all the other selected frequency bins. Thus, all the frequency bins may be scaled to share an exponent.

In an embodiment, the radio apparatus determines magnitude of each frequency bin of the group of adjacent frequency bins, select a frequency bin value with the greatest magnitude among the group of adjacent frequency bin values, generate the common exponent based on the frequency bin value having the greatest magnitude, and generate the mantissas of the floating point number representation to share the common exponent. The mantissas may be generated so that they share the common exponent. This may mean that the mantissas may be generated so that the floating point number representation may represent the values of the group of adjacent frequency bins. Thus, the scale of each mantissa may need to be so that the mantissas, together with the value of the common exponent, represent the values of the selected group of adjacent frequency bins.

As previously said, the frequency bin values may be represented as floating point numbers. The scaling of the frequency bin values to share a single exponent may be done before or after the transformation to the floating point number representation. Thus, it may be possible to scale the frequency bins' values even if they are in binary form. On the other hand, it may be possible to scale the mantissas of the floating point numbers to share an exponent. In any case, the result of the scaling may be the same, but in some embodiments other way of doing the scaling may be beneficial. The mantissas and the shared exponent may be represented with binary values, for example. Decimal representation may also be possible. Naturally, the floating point number representation may comprise a sign for each floating point number. The sign may be a sign bit, for example.

In an embodiment, each of the mantissas comprises a sign bit.

Figure 3A:
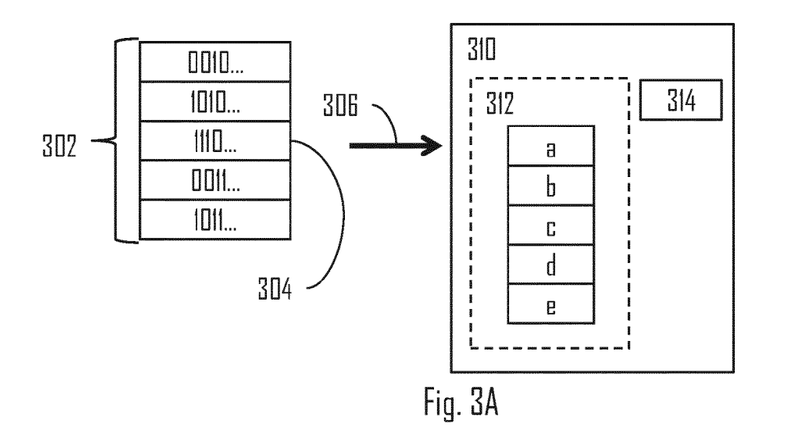
FIG. 3A illustrates an embodiment of the invention.

FIG. 3A illustrates an embodiment of the invention. Referring to FIG. 3A, the transformed signal may be represented in the frequency-domain shown by blocks 302. Each block's value may correspond to a frequency block value of the group of adjacent frequency bins. As said before, the frequency bins' values may be represented in binary form as in blocks 302. The block with greatest magnitude may be the block 304. Arrow 306 may correspond to step 206 of FIG. 2, wherein a block of floating point numbers 310 is generated from the group of frequency bins' values. The block of floating point numbers may comprise a mantissa part 312, wherein mantissas from a to e may correspond to the blocks' 302 values, and wherein the common exponent 314 is shared between the mantissas of the mantissa part 312.

The common exponent 314 may be based on the block 304 which may have the greatest magnitude. However, it may be possible to use other ways to determine the common exponent 314. In an embodiment, the radio apparatus determines a mean value of the blocks 302. The mean value may mean the mean power of the frequency bins. The mean value may be used to generate the common exponent 314, and the mantissas 312 may be generated accordingly. There may be a chance of clipping the frequency bins' values by using the mean value for the generation of the common exponent 314. In order to prevent this radio apparatus may verify that the mantissas 312 are generated so that the values are not clipped. If the radio apparatus determines that using a certain common exponent 314 the mantissas 312 may be clipped, the radio apparatus may adjust the common exponent 314, and eventually the mantissas 312 so that clipping does not happen, and that the block of floating point numbers 310 may represent the values of blocks 302 as intended.

In an embodiment, the radio apparatus determines that at least one frequency bin's value will be clipped, when a group of frequency bins' values are represented with the mantissas 312 and the common exponent 314. This may mean that the common exponent 314 comprises a single value which is a shared exponent between the mantissas 312. The radio apparatus may then increase the value of the mean value to a level, wherein the level is so high that the frequency bins' values will not be clipped. Naturally, as the value of common exponent 314 may be based on the said level, the mantissas 312 may need to be scaled accordingly.

As described earlier, the common exponent 314 may be based on the frequency bin with the greatest magnitude, mean value of the frequency bins' values and/or the increased mean value, which was done to prevent clipping. In an embodiment, the radio apparatus may determine dynamic range based at least partly on the described values. The dynamic range may define the range of frequency bins' values, which are represented with the mantissas 312 and the common exponent 314. For example, the dynamic range may be formed so that some frequency bins' values may not be within the dynamic range. In such case, the dynamic range may be adjusted so that the values are within the dynamic range. The amount of bits used for representing the mantissa may determine the dynamic range. For example, the more bits are used to represent the mantissas, the wider the dynamic range may be.

In an embodiment, the upper limit of the dynamic range is the frequency bin's value with the greatest magnitude. In an embodiment, the mean value defines the average of the dynamic range. The size of the dynamic range may be further defined by the radio apparatus. The lower limit of the dynamic range may be the frequency bin's value with the lowest magnitude, which may be determined by the radio apparatus.

In an embodiment, the radio apparatus may further select a second group of adjacent frequency bins from the frequency-domain presentation, generate a second floating point number representation from values of the second group of frequency bins, wherein the second floating point number representation comprises a mantissa for each of the frequency bins' values of the second group of adjacent frequency bins, and wherein the second floating point number representation further comprises a second common exponent shared between the mantissas of the second floating point number representation, and output the second floating point number representation.

The second group of adjacent frequency bins may be selected after the outputting of block 208. In an embodiment, the radio apparatus may select the second group in parallel with the blocks 202-208 of FIG. 2. The second group may be sent by another terminal device than the first selected group.

In an embodiment, the outputting may comprise outputting the mantissas of the second floating point number representation, and the value of the second common exponent shared between the mantissas of the second floating point number representation.

Figure 3B:
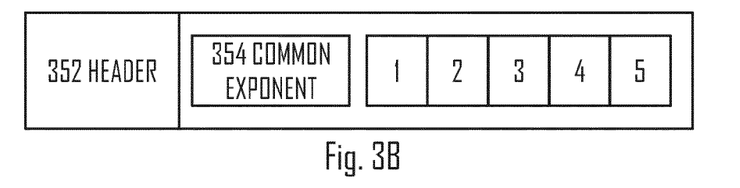
FIG. 3B illustrates an embodiment of the invention.

FIG. 3B illustrates the outputting of the floating point number presentation according to an embodiment of the invention. Referring to FIG. 3B, the radio apparatus may output the floating point number presentation as described earlier. The outputting may comprise signaling and/or transmitting the floating point number presentation to a second radio apparatus and/or to the system module 122, for example. The floating point number presentation may comprise a header part 352. The header 352 may comprise time stamps and/or information about the terminal device for which the data of the floating point number presentation belongs to, for example. The outputted floating point number presentation may further comprise the mantissas numbered from 1 to 5 in FIG. 3B. Each mantissa may be scaled to share a common exponent 354. Thus, the floating point number presentation may comprise only the one common exponent 354 shared between the mantissas.

In an embodiment, the radio apparatus outputs only one exponent value, such as the exponent 354, and the mantissas, which all share the same one exponent value.

In an embodiment, the common exponent 354 comprises or is the common exponent 314 of FIG. 3A. The mantissas, numbered from 1 to 5, may comprise or be the mantissas of FIG. 3A.

The radio apparatus may output the floating point number presentation, wherein the value of the common exponent 354 is outputted together with the mantissas. Data transmission may be more efficient, as only the one common exponent 354 value is sent compared to a situation where every mantissa has an individual exponent.

In an embodiment, the each mantissa of FIG. 3B comprises a sign bit, wherein the sign bit is a part of the floating point number presentation.

Figure 4A:
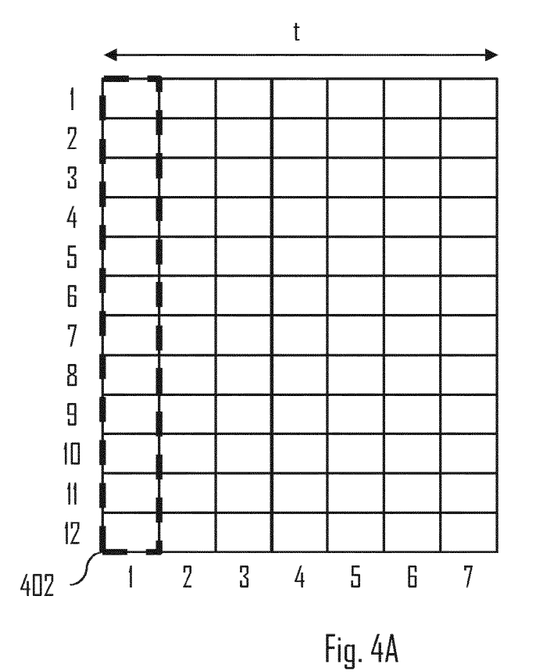
FIG. 4A illustrates a physical resource block of a telecommunication system according to an embodiment of the invention.

FIG. 4A illustrates a PRB according to an embodiment of the invention. The PRB may be a basic frequency block of the telecommunication system, such as the LTE or LTE-A for example. The PRB may last for a 0.5 millisecond (ms) time slot. One sub-frame of a radio frame, such as LTE frame, may comprise two PRBs. The PRB may comprise a number of single carrier frequency division multiple access (SC-FDMA) and/or orthogonal frequency division multiplexing (OFDM) symbols. Furthermore, the PRB may comprise frequency bins. One PRB may comprise 7 symbols, such as OFDM and/or SC-FDMA symbols numbered from 1 to 7, and 12 frequency bins numbered from 1 to 12. The symbols and the frequency bins may form a 7×12 matrix, which may represent the PRB. Referring to FIG. 4A, the radio apparatus may select a group of adjacent frequency bins 402 from the PRB. As shown in FIG. 4, the selected group 402 may be on the same time. The selected group 402 may be represented as a block of floating point numbers, as described earlier.

In an embodiment, the selected group of adjacent frequency bins 402 represents a symbol, such as OFDM symbol, of the PRB, and wherein the PRB is a physical resource block of a cellular telecommunication system. In an embodiment, each of the frequency bins represents or is a sub-carrier of the PRB.

In an embodiment, the group of adjacent frequency bins 402 represents a PRB of telecommunication system, wherein the PRB comprises frequency bins which are on the same time.

Figure 4B:
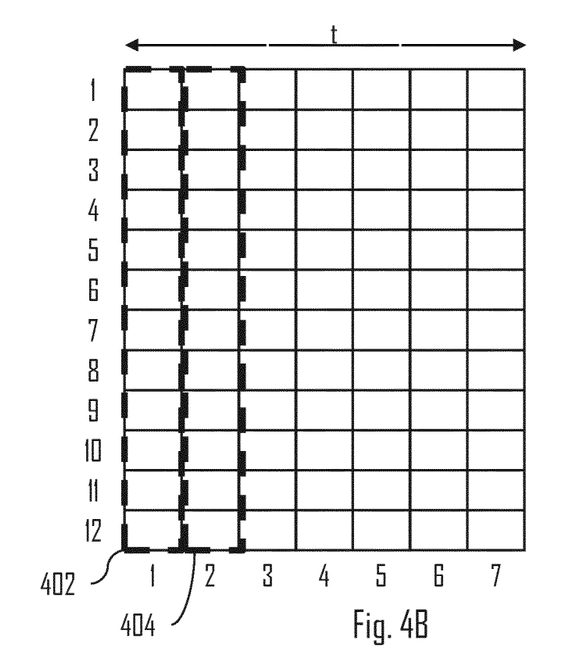
FIG. 4B illustrates a physical resource block of a telecommunication system according to an embodiment of the invention.

Let us now look a little closer on how the exponent may be shared with a larger group of frequency bins. FIG. 4B illustrates an embodiment of the invention. Referring to FIG. 4B, the radio apparatus may select a third group of adjacent frequency bins 404, wherein the third group may represent a second OFDM symbol of the PRB. The radio apparatus may generate a third floating point number representation from values of the third group of frequency bins 404, wherein the third floating point number representation may comprise a mantissa for each of the frequency bins' values of the third group of adjacent frequency bins, and wherein the said mantissas may be scaled so that the common exponent may be shared between the mantissas of the floating point number representation, illustrated in FIG. 2, and the third floating point representation. Thus, the common exponent may be shared between the floating point number representations of the groups 402, 404. The PRB, in which the both groups may be comprised in, may belong to a same terminal device.

The groups 402, 404 may not be in same time, as in they may not be received and/or transmitted at the same time. The compression may be a bit higher, as the groups 402, 404 may not need a group-specific common exponent. The radio apparatus may wait for both groups 402, 404 before starting to process them. Thus, the common exponent for both of the groups may be determined according to the group 402 and/or the group 404, and the mantissas representing the values of groups 402, 404 may be scaled accordingly. The common exponent may be generated as described earlier. The radio apparatus may output the third floating point number representation together with the original floating point number representation. This may mean that the mantissas of the original and the third floating point number presentation are outputted together with the value of the common exponent shared between the mantissas of the original and the third floating point number presentation. For example, there may be only one common exponent outputted and/or transmitted for the groups 402, 404, and thus data transmission may be a lot smaller compared to the situation where each mantissa has a own exponent.

In an embodiment, the common exponent is shared between one or more PRBs that are adjacent in frequency domain. It may be possible for an OFDM symbol, which reaches over at least two PRBs, to share the common exponent. This may mean that frequency bins, which are within the same OFDM symbol, from the at least two PRBs share the same common exponent. The at least two PRBs may belong to a same terminal device.

In an embodiment, the frequency bins' values comprise I and Q components. The I and Q component may share the common exponent. In an embodiment, the mantissa representations of the I and Q components are scaled to share the same exponent. In an embodiment, the floating point number representation of block 402 may comprise mantissas for both I and Q values, wherein the I and Q values share the common exponent with all the mantissa in the said floating point number representation. It may be possible to use a different exponent for I and Q values so that the representation of the group 402 may comprise two exponents, wherein the first exponent is for I values and the second exponent is for the Q values. Naturally, these exponents may be shared between OFDM symbols, and also with PRBs as described later. This may mean that for a group of frequency bins' values, mantissa values for both I and Q values may be outputted, wherein first and second exponent values are also outputted, wherein the first exponent value is common to the mantissa values representing the I values, and wherein the second exponent value is common to the mantissa values representing the Q values.

In an embodiment, the first exponent value is shared between the mantissa values representing the I and Q values.

In an embodiment, the radio apparatus is configured to receive configuration information, and wherein the configuration information determines which PRBs can share a common exponent. The radio apparatus may use the information to determine should it wait for other OFDM symbols of the PRB and/or other PRBs before further processing the received data. When and exponent is shared between frequency bins within a same OFDM symbol, the radio apparatus may perform the compression and send the data forward without waiting for other OFDM symbols. This may happen automatically. The compression may happen in that case in a way that the latency of the system is not significantly increased.

The configuration information may also be used to determine, by the radio apparatus, that two or more simultaneously received OFDM symbols from different PRBs may share a common exponent. This may happen if the two or more PRBs are utilized by a single terminal device.

Figure 5:
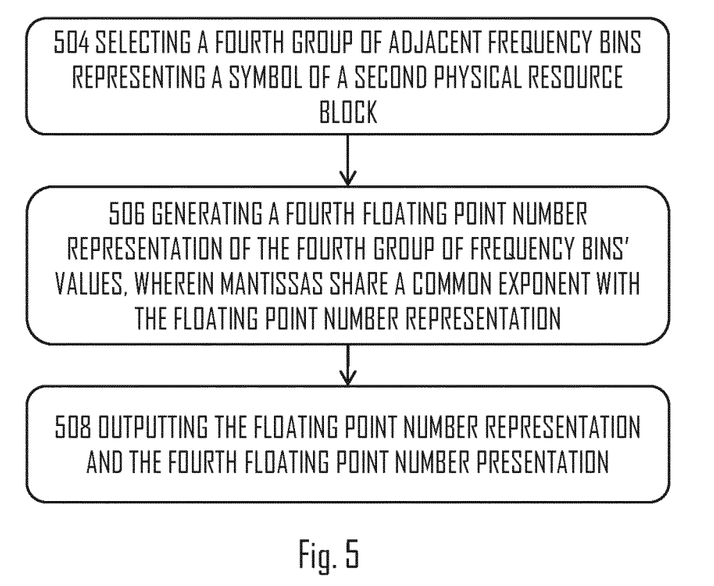
FIG. 5 illustrates a flow diagram according to an embodiment of the invention.

FIG. 5 illustrates a flow diagram according to an embodiment of the invention. In step 504, the radio apparatus may select a fourth group of adjacent frequency bins from the frequency-domain presentation, wherein the fourth group may represent a first OFDM symbol of a second PRB. The second PRB may be received and/or transmitted at the same time as the previously mentioned PRB. In step 506, the radio apparatus may generate a fourth floating point number representation from values of the fourth group of frequency bins, wherein the fourth floating point number representation may comprise a mantissa for each of the frequency bins' values of the fourth group of frequency bins, and wherein the said mantissas may be scaled so that the common exponent is shared between the mantissas of the floating point number representation, illustrated in FIG. 2, and the fourth floating point number representation.

In step 508, the radio apparatus may output the mantissas of the floating point number representation and the fourth floating point number representation together with the common exponent shared between the mantissas of the floating point number representation and the fourth floating point number representation. Using the above-mentioned approach, the compression rate may be increased without increasing latency, as the PRBs may be simultaneous.

The embodiments described in FIGS. 4B and 5 may be also used together. This may mean that one or more OFDM symbols from at least two PRBs may share a common exponent. It needs to be noted that normally PRBs may be allocated to different terminal devices. In such case the exponent may not be shared between PRBs as the information within different PRBs may belong to different terminal devices. If in the other hand a single terminal device may use more than one PRB, the exponent may be shared between the PRBs. As said earlier, the exponent may be shared between OFDM symbols from different PRBs which are simultaneous and/or with groups of simultaneous OFDM symbols. In an embodiment, at least two PRBs share an exponent.

The use of the common exponent for multiple PRBs may be possible, for example, if multiple input multiple output (MIMO) is utilized. With MIMO it may be possible for the radio apparatus to receive a plurality of spatially distributed PRBs allocated to a single terminal device simultaneously. The plurality of PRBs may be sent on the same frequency and/or band, by the terminal device, but the PRBs may be spatially separable. The radio apparatus may obtain information about the allocation of PRBs. The allocation information may comprise information about to which terminal device each PRB belongs to. The PRB sent by a terminal device may comprise information about the terminal device that has transmitted the said PRB. The radio apparatus may use the obtained information to select a group of frequency bins from the plurality of PRBs, and generate a floating point number representation of the said group, similarly as describe above. This may allow the radio apparatus to generate the representation from the plurality of PRBs that may be sent on the same band, but are spatially separable.

The radio apparatus may further obtain and/or receive scheduling information about terminal devices. For example, if a terminal device requires more resources to transmit data, the radio apparatus may allocate more PRBs for the said terminal device, and use the described invention to compress the received data from the said terminal device. Thus, the radio apparatus may act dynamically by receiving the scheduling information and, as a response to the said receiving, allocate resources and compress data.

In an embodiment, the MIMO comprises multi-user MIMO. In such a case, the radio apparatus may determine to which terminal device a received PRB belongs to. The received PRB may comprise identity information about the terminal device, or the radio apparatus may some other way associate the received PRBs to a certain terminal device. The association may, for example, be based on the direction from where the PRBs were received. In an embodiment, the radio apparatus receives a signal comprising a first and second parts, determines that the first part belongs to a first terminal device and that the second part belongs to a second terminal device. The radio apparatus may compress the received parts of signals as described in FIG. 2, so that the compression is done as terminal specific function. Thus, the exponents may not be shared between the first and second terminal devices, but for each of the first and second terminal devices a unique floating point number representation is generated and outputted.

The compression may cause a frequency bin to lose data, as the mantissa may be scaled according to the common exponent. The data loss may depend on how many bits are used to represent the mantissa. The amount of bits used for the mantissa may vary in different use cases. For example, the amount of bits may depend on the communication interface's 130 ability to transfer data. Larger mantissa may be used in scenarios where there is no need for further compression, and alternatively smaller mantissa may be used to obtain larger compression.

In an embodiment, the radio apparatus may determine, based on the communication interface's 130 ability to transfer data and/or received controlling signal that the size of the mantissa needs to be changed. The radio apparatus may further increase and/or decrease the amount of bits used for representing the mantissa. The radio apparatus may select the amount of bits used to represent the mantissa from a set of predetermined parameters.

In an embodiment, each mantissa is represented with a same amount of bits. This may be beneficial for sake of simplicity. Each mantissa may comprise, for example, five or six bits. Other amount of bits may also be possible. In an embodiment, 12 bits are used to represent the common exponent shared between mantissas. Other amount of bits may also be possible.

Figure 6:
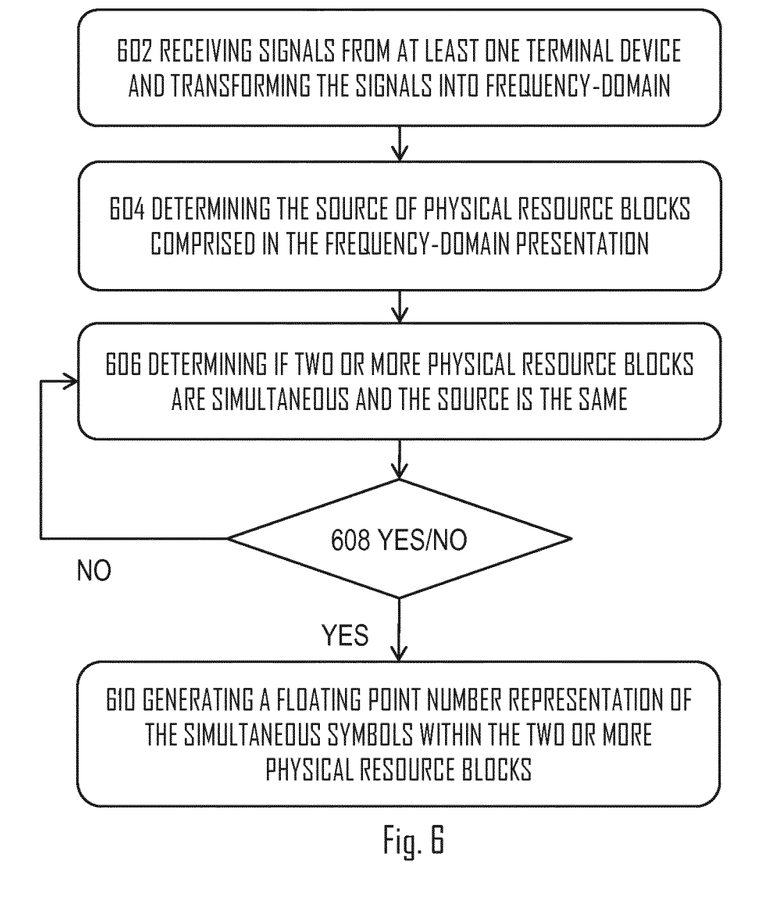
FIG. 6 illustrates a flow diagram according to an embodiment of the invention.

FIG. 6 illustrates a flow diagram of an embodiment of the invention. Referring to FIG. 6, the radio apparatus may receive signals from at least one terminal device and transform the signals into frequency-domain (block 602). This may happen similarly as described earlier. The transformation may be automatic and the radio apparatus may determine how the transformation is done. In step 604, the radio apparatus may determine the source of PRBs comprised in the frequency-domain presentation. A single PRB may belong to single terminal device, but it may be possible that two or more PRBs are sent by the single terminal device. As the different PRBs may be received and/or sent simultaneously, the single terminal device may send two or more PRBs at least somewhat simultaneously. In step 606, the radio apparatus may determine if the two or more PRBs are simultaneous and the source is the same, meaning that the simultaneous PRBs are sent by the same terminal device. If the determining in block 606 is negative, the radio apparatus may continue on determining other PRBs, as shown with an arrow from block 608 to block 606.

If in the other hand the determining (block 606) is positive, the radio apparatus may proceed from block 608 to generating a floating point number representation of the simultaneous OFDM symbols within the two or more physical resource blocks as shown in step 610. This may mean that even though the two or more PRBs are sent by the same terminal device and are simultaneous, the common exponent is shared only between simultaneous OFDM symbols of the two or more PRBs. As described earlier, this may not increase the latency of the system significantly. However, if the common exponent is shared between OFDM symbols that are not simultaneous, the latency may increase. In some cases this may be acceptable to increase the compression.

In an embodiment, the described solution may be used in a large AAS system.

Even though many of the embodiments of the invention are described to be applied with OFDM symbols, the invention may be applied to other radio symbols, such as SC-FDMA symbols, as well.

Figure 7:
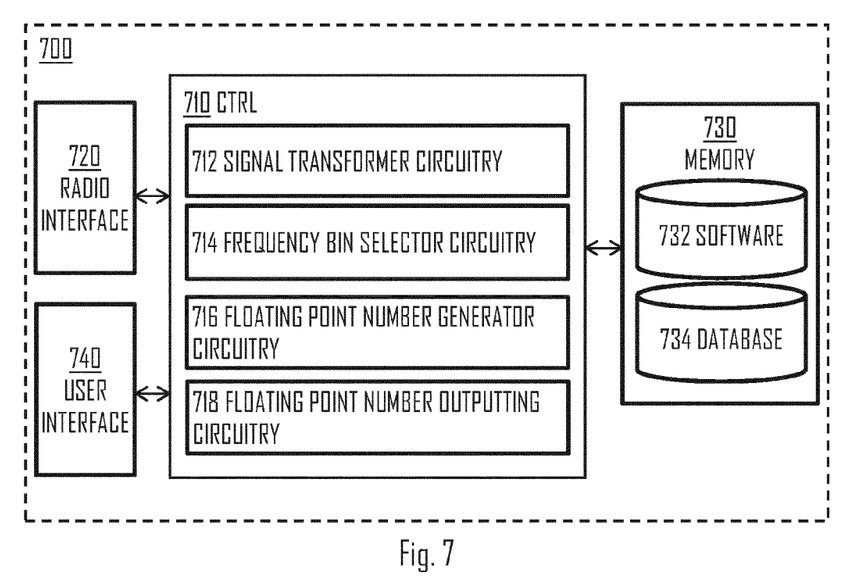
FIG. 7 illustrates an apparatus according to an embodiment of the invention.

FIG. 7 provides apparatus 700 comprising a control circuitry (CTRL) 710, such as at least one processor, and at least one memory 730 including a computer program code (software) 732, wherein the at least one memory and the computer program code (software) 732, are configured, with the at least one processor, to cause the respective apparatus 700 to carry out any one of the embodiments of FIGS. 1 to 6, or operations thereof.

In an embodiment, these operations may comprise tasks, such as, transforming, by a radio apparatus, a signal from a time-domain presentation into a frequency-domain presentation, wherein the signal is represented as frequency bin values, selecting a group of adjacent frequency bins from the frequency-domain presentation, generating a floating point number representation from values of the group of adjacent frequency bins, wherein the floating point number representation comprises a mantissa for each of the frequency bins' values of the group of adjacent frequency bins, and wherein the floating point number representation further comprises a common exponent shared between the mantissas, and outputting the mantissas of the floating point number representation, and the value of the common exponent shared between the mantissas of the floating point number representation.

Referring to FIG. 7, the memory 730 may be implemented using any suitable data storage technology, such as semiconductor based memory devices, flash memory, magnetic memory devices and systems, optical memory devices and systems, fixed memory and removable memory. The memory 730 may comprise a database 734 for storing data.

The apparatus 700 may further comprise radio interface (TRX) 720 comprising hardware and/or software for realizing communication connectivity according to one or more communication protocols. The TRX may provide the apparatus with communication capabilities to access the radio access network and enable communication between network nodes, for example. The TRX may comprise the above-mentioned X2-interface. The TRX may comprise standard well-known components such as an amplifier, filter, frequency-converter, (de)modulator, and encoder/decoder circuitries and one or more antennas.

The apparatus 700 may also comprise user interface 740 comprising, for example, at least one keypad, a microphone, a touch display, a display, a speaker, etc. Each user interface may be used to control the respective apparatus by the user.

In an embodiment, the apparatus 700 may be or be comprised in a base station (also called a base transceiver station), a Node B, a radio network controller, an evolved Node B or RRH, for example. In an embodiment, the apparatus 700 is or is comprised in the radio apparatus performing the steps of FIG. 2.

The control circuitry 710 may comprise a signal transformer circuitry 712 configured to transform a signal from a time-domain presentation into a frequency-domain presentation, wherein the signal is represented as frequency bin values. The signal transformer circuitry 712 may comprise FFT circuitry, for example. The control circuitry 710 may further comprise a frequency bin selector circuitry 714 configured to select a group of adjacent frequency bins from the frequency-domain presentation. The control circuitry 710 may further comprise a floating point number generator circuitry 716 configured to generate a floating point number representation from values of the group of adjacent frequency bins, wherein the floating point number representation comprises a mantissa for each of the frequency bins' values of the group of adjacent frequency bins, and wherein the floating point number representation further comprises a common exponent shared between the mantissas.

The control circuitry may further comprise a floating point number outputting circuitry 718 configured to output the mantissas of the floating point number representation, and the value of the common exponent shared between the mantissas of the floating point number representation. The outputting circuitry 718 may, for example, output the floating point number representation of FIG. 3B. The floating point number outputting circuitry 718 may comprise a transmitter and/or signaling circuitry.

Figure 8:
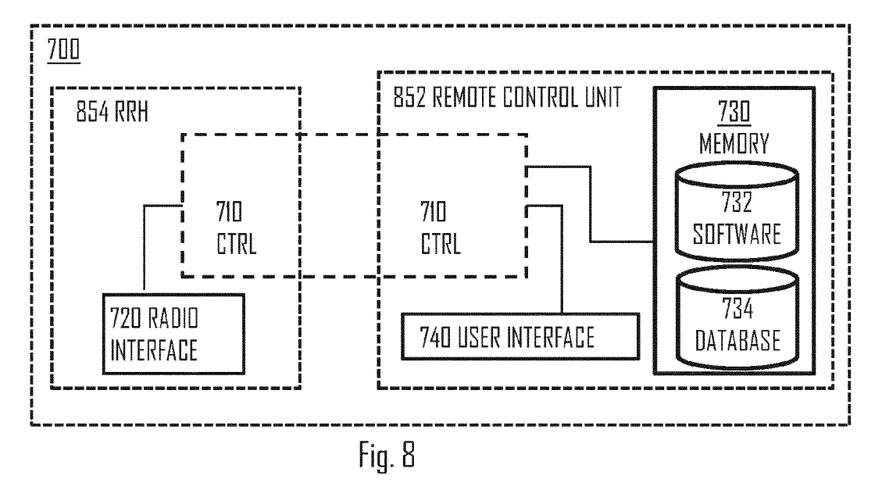
FIG. 8 illustrates an embodiment of the invention.

In an embodiment, as shown in FIG. 8, at least some of the functionalities of the apparatus 700 may be shared between two physically separate devices, forming one operational entity. Therefore, the apparatus 700 may be seen to depict the operational entity comprising one or more physically separate devices for executing at least some of the described processes. Thus, the apparatus 700 of FIG. 8, utilizing such shared architecture, may comprise a remote control unit (RCU) 852, such as a host computer or a server computer, operatively coupled (e.g. via a wireless or wired network) to a remote radio head (RRH) 854 located in the base station. In an embodiment, at least some of the described processes may be performed by the RCU 852. In an embodiment, the execution of at least some of the described processes may be shared among the RRH 854 and the RCU 852.

In an embodiment, the RCU 852 may generate a virtual network through which the RCU 852 communicates with the RRH 854. In general, virtual networking may involve a process of combining hardware and software network resources and network functionality into a single, software-based administrative entity, a virtual network. Network virtualization may involve platform virtualization, often combined with resource virtualization. Network virtualization may be categorized as external virtual networking which combines many networks, or parts of networks, into the server computer or the host computer (i.e. to the RCU). External network virtualization is targeted to optimized network sharing. Another category is internal virtual networking which provides network-like functionality to the software containers on a single system. Virtual networking may also be used for testing the terminal device.

In an embodiment, the virtual network may provide flexible distribution of operations between the RRH and the RCU. In practice, any digital signal processing task may be performed in either the RRH or the RCU and the boundary where the responsibility is shifted between the RRH and the RCU may be selected according to implementation.

As used in this application, the term 'circuitry' refers to all of the following: (a) hardware-only circuit implementations, such as implementations in only analog and/or digital circuitry, and (b) combinations of circuits and soft-ware (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device.

In an embodiment, at least some of the processes described in connection with FIGS. 1 to 6 may be carried out by an apparatus comprising corresponding means for carrying out at least some of the described processes. Some example means for carrying out the processes may include at least one of the following: detector, processor (including dual-core and multiple-core processors), digital signal processor, controller, receiver, transmitter, encoder, decoder, memory, RAM, ROM, software, firmware, display, user interface, display circuitry, user interface circuitry, user interface software, display software, circuit, antenna, antenna circuitry, and circuitry. In an embodiment, the at least one processor, the memory, and the computer program code form processing means or comprises one or more computer program code portions for carrying out one or more operations according to any one of the embodiments of FIGS. 1 to 6 or operations thereof. In an embodiment, these operations may comprise tasks, such as, transforming, by a radio apparatus, a signal from a time-domain presentation into a frequency-domain presentation, wherein the signal is represented as frequency bin values, selecting a group of adjacent frequency bins from the frequency-domain presentation, generating a floating point number representation from values of the group of adjacent frequency bins, wherein the floating point number representation comprises a mantissa for each of the frequency bins' values of the group of adjacent frequency bins, and wherein the floating point number representation further comprises a common exponent shared between the mantissas, and outputting the mantissas of the floating point number representation, and the value of the common exponent shared between the mantissas of the floating point number representation.

According to yet another embodiment, the apparatus carrying out the embodiments comprises a circuitry including at least one processor and at least one memory including computer program code. When activated, the circuitry causes the apparatus to perform at least some of the functionalities according to any one of the embodiments of FIGS. 1 to 6, or operations thereof. In an embodiment, these operations may comprise tasks, such as, transforming, by a radio apparatus, a signal from a time-domain presentation into a frequency-domain presentation, wherein the signal is represented as frequency bin values, selecting a group of adjacent frequency bins from the frequency-domain presentation, generating a floating point number representation from values of the group of adjacent frequency bins, wherein the floating point number representation comprises a mantissa for each of the frequency bins' values of the group of adjacent frequency bins, and wherein the floating point number representation further comprises a common exponent shared between the mantissas, and outputting the mantissas of the floating point number representation, and the value of the common exponent shared between the mantissas of the floating point number representation.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chip set (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

Embodiments as described may also be carried out in the form of a computer process defined by a computer program or portions thereof. Embodiments of the methods described in connection with FIGS. 1 to 6 may be carried out by executing at least one portion of a computer program comprising corresponding instructions. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a person of ordinary skill in the art.

Even though the invention has been described above with reference to an example according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. A method comprising:
    performing uplink data compression comprising:
    transforming, by a radio apparatus, a signal from a time-domain presentation into a frequency-domain presentation, wherein the signal is represented as frequency bin values;
    selecting a first group of adjacent frequency bins from the frequency-domain presentation;
    generating a first floating point number representation from values of the first group of adjacent frequency bins, wherein the first floating point number representation comprises a mantissa for each of the frequency bins' values of the first group of adjacent frequency bins, and wherein the first floating point number representation further comprises a first common exponent shared between the mantissas;
    outputting the mantissas of the first floating point number representation, and the value of the first common exponent shared between the mantissas of the first floating point number representation;
    communicating the output mantissas and the value of the first common exponent toward a device for decoding using at least the output mantissa and the value of the first common exponent;
    selecting a second group of adjacent frequency bins from the frequency-domain presentation;
    generating a second floating point number representation from values of the second group of frequency bins, wherein the second floating point number representation comprises a mantissa for each of the frequency bins' values of the second group of adjacent frequency bins, and wherein the second floating point number representation further comprises a second common exponent shared between the mantissas of the second floating point number representation; and
    outputting the mantissas of the second floating point number representation, and the value of the second common exponent shared between the mantissas of the second floating point number representation.

2. The method of claim 1, wherein the group of adjacent frequency bins represents a symbol of a physical resource block, and wherein the physical resource block is a physical resource block of a cellular telecommunication system.

3. The method of claim 2, further comprising:
    selecting an other group of adjacent frequency bins from the frequency-domain presentation, wherein the other group represents a first symbol of a second physical resource block;
    generating an other floating point number representation from values of the other group of frequency bins, wherein the other floating point number representation comprises a mantissa for each of the frequency bins' values of the other group of adjacent frequency bins, and wherein the said mantissas are scaled so that the first common exponent is shared between the first floating point number representation and the other floating point representation; and outputting the mantissas of the first and other floating point number representations, and the value of the first common exponent shared between the mantissas of the first and other floating point number representations.

4. The method of claim 2, further comprising:
selecting an other group of adjacent frequency bins from the frequency-domain presentation, wherein the other group represents a second symbol of the physical resource block;
generating an other floating point number representation from values of the other group of frequency bins, wherein the other floating point number representation comprises a mantissa for each of the frequency bins' values of the other group of adjacent frequency bins, and wherein the mantissas of the other floating point representation are scaled so that the first common exponent is shared between the mantissas of the first floating point number representation and the mantissas of the other floating point representation; and
outputting the mantissas of the first and other floating point number representations, and the value of the first common exponent shared between the mantissas of the first and other floating point number representations.

5. The method of claim 1, wherein the frequency bins' values comprise in-phase component and quadrature component, and wherein the in-phase and quadrature components are scaled to share a common exponent.

6. The method of claim 1, wherein each mantissa is represented with a same amount of bits.

7. A computer program product embodied on a non-transitory computer readable medium readable and comprising program instructions which, when loaded into an apparatus, cause the apparatus to execute operations in the method of claim 1.

8. A method comprising:
performing uplink data compression comprising:
transforming, by a radio apparatus, a signal from a time-domain presentation into a frequency-domain presentation, wherein the signal is represented as frequency bin values;
selecting a first group of adjacent frequency bins from the frequency-domain presentation;
generating a first floating point number representation from values of the first group of adjacent frequency bins, wherein the first floating point number representation comprises a mantissa for each of the frequency bins' values of the first group of adjacent frequency bins, and wherein the first floating point number representation further comprises a first common exponent shared between the mantissas;
outputting the mantissas of the first floating point number representation, and the value of the first common exponent shared between the mantissas of the first floating point number representation;
communicating the output mantissas and the value of the first common exponent toward a device for decoding using at least the output mantissa and the value of the first common exponent;
determining magnitude of each frequency bin of the first group of adjacent frequency bins;
selecting a frequency bin value with the greatest magnitude among the first group of adjacent frequency bin values;
generating the first common exponent based on the frequency bin value having the greatest magnitude; and
generating the mantissas of the first floating point number representation to share the first common exponent.

9. A computer program product embodied on a non-transitory computer readable medium readable and comprising program instructions which, when loaded into an apparatus, cause the apparatus to execute operations in the method of claim 8.

10. An apparatus comprising:
at least one processor and at least one memory including a computer program code, wherein the at least one memory and the computer program code are configured, with the at least one processor, to cause a radio apparatus to perform operations comprising:
performing uplink data compression comprising:
transforming, by a radio apparatus, a signal from a time-domain presentation into a frequency-domain presentation, wherein the signal is represented as frequency bin values;
selecting a first group of adjacent frequency bins from the frequency-domain presentation;
generating a first floating point number representation from values of the first group of adjacent frequency bins, wherein the first floating point number representation comprises a mantissa for each of the frequency bins' values of the first group of adjacent frequency bins, and wherein the first floating point number representation further comprises a first common exponent shared between the mantissas;
outputting the mantissas of the first floating point number representation, and the value of the first common exponent shared between the mantissas of the first floating point number representation;
communicating the output mantissas and the value of the first common exponent toward a device for decoding using at least the output mantissa and the value of the first common exponent;
selecting a second group of adjacent frequency bins from the frequency-domain presentation;
generating a second floating point number representation from values of the second group of frequency bins, wherein the second floating point number representation comprises a mantissa for each of the frequency bins' values of the second group of adjacent frequency bins, and wherein the second floating point number representation further comprises a second common exponent shared between the mantissas of the second floating point number representation; and
outputting the mantissas of the second floating point number representation, and the value of the second common exponent shared between the mantissas of the second floating point number representation.

11. The apparatus of claim 10, wherein the group of adjacent frequency bins represents a symbol of a physical resource block, and wherein the physical resource block is a physical resource block of a cellular telecommunication system.

12. The apparatus of claim 11, wherein the at least one memory and the computer program code are configured, with the at least one processor, to cause the radio apparatus further to perform operations comprising:
selecting an other group of adjacent frequency bins from the frequency-domain presentation, wherein the other group represents a second symbol of the physical resource block;
generating an other floating point number representation from values of the other group of frequency bins, wherein the other floating point number representation comprises a mantissa for each of the frequency bins' values of the other group of adjacent frequency bins, and wherein the mantissas of the other floating point representation are scaled so that the first common exponent is shared between the mantissas of the first floating point number representation and the mantissas of the other floating point representation; and outputting the mantissas of the first and other floating point number representations, and the value of the first common exponent shared between the mantissas of the first and other floating point number representations.

13. The apparatus of claim 11, wherein each of the frequency bins represent a sub-carrier of the physical resource block.

14. The apparatus of claim 11, wherein the at least one memory and the computer program code are configured, with the at least one processor, to cause the radio apparatus further to perform operations comprising:

selecting an other group of adjacent frequency bins from the frequency-domain presentation, wherein the other group represents a first symbol of a second physical resource block;

generating an other floating point number representation from values of the other group of frequency bins, wherein the other floating point number representation comprises a mantissa for each of the frequency bins' values of the other group of adjacent frequency bins, and wherein the said mantissas are scaled so that the first common exponent is shared between the first floating point number representation and the other floating point representation; and outputting the mantissas of the first and other floating point number representations, and the value of the first common exponent shared between the mantissas of the first and other floating point number representations.

15. The apparatus of claim 10, wherein the frequency bins' values comprise in-phase component and quadrature component, and wherein the in-phase and quadrature components are scaled to share a common exponent.

16. The apparatus of claim 10, wherein each mantissa is represented with a same amount of bits.

17. The apparatus of claim 10, wherein each mantissa is represented with five bits.

18. The apparatus of claim 10, wherein the device comprises a system module and wherein communicating further comprises communicating the output mantissas and the value of the first common exponent toward through a communication interface toward the system module.

19. The apparatus of claim 18, wherein the communication interface utilizes one or more of the following: Ethernet, optical fiber, common public radio interface (CPRI) and open base station standard initiative (OBSAI) RP3.

20. An apparatus comprising:

at least one processor and at least one memory including a computer program code, wherein the at least one memory and the computer program code are configured, with the at least one processor, to cause a radio apparatus to perform operations comprising:

performing uplink data compression comprising:

transforming, by a radio apparatus, a signal from a time-domain presentation into a frequency-domain presentation, wherein the signal is represented as frequency bin values;

selecting a first group of adjacent frequency bins from the frequency-domain presentation;

generating a first floating point number representation from values of the first group of adjacent frequency bins, wherein the first floating point number representation comprises a mantissa for each of the frequency bins' values of the first group of adjacent frequency bins, and wherein the first floating point number representation further comprises a first common exponent shared between the mantissas;

outputting the mantissas of the first floating point number representation, and the value of the first common exponent shared between the mantissas of the first floating point number representation;

communicating the output mantissas and the value of the first common exponent toward a device for decoding using at least the output mantissa and the value of the first common exponent;

determining magnitude of each frequency bin of the first group of adjacent frequency bins;

selecting a frequency bin value with the greatest magnitude among the first group of adjacent frequency bin values;

generating the first common exponent based on the frequency bin value having the greatest magnitude; and generating the mantissas of the first floating point number representation to share the first common exponent.

* * * * *

UNITED STATES PATENT AND TRADEMARK OFFICE
CERTIFICATE OF CORRECTION

PATENT NO. : 9,979,413 B2
APPLICATION NO. : 15/513250
DATED : May 22, 2018
INVENTOR(S) : Piirainen Page 1 of 1

It is certified that error appears in the above-identified patent and that said Letters Patent is hereby corrected as shown below:

Claim 14, Column 17, Line 19 "first" should be deleted and --second-- should be inserted.

Claim 14, Column 17, Line 19 "a second" should be deleted and --the-- should be inserted.

Claim 14, Column 17, Line 26 "said" should be deleted in between --the-- and --mantissas--.

Claim 14, Column 17, Line 26 after mantissas please insert --of the other floating point representation--.

Claim 14, Column 17, Line 27 after the please insert --mantissas of the--.

Claim 14, Column 17, Line 28 after the please insert --mantissas of the--.

Signed and Sealed this
Third Day of July, 2018

Andrei Iancu
*Director of the United States Patent and Trademark Office*